US011870455B2

United States Patent
Li et al.

(10) Patent No.: US 11,870,455 B2
(45) Date of Patent: Jan. 9, 2024

(54) ANALOG-TO-DIGITAL CONVERSION METHOD, ANALOG-TO-DIGITAL CONVERTER AND IMAGE SENSOR

(71) Applicant: Shenzhen RGBIC Microelectronics Technology Co., Ltd, Shenzhen (CN)

(72) Inventors: Zhisheng Li, Shenzhen (CN); Jia Guo, Shenzhen (CN)

(73) Assignee: Shenzhen RGBIC Microelectronics Technology Co., Ltd, Shenzhen (CN)

( * ) Notice: Subject to any disclaimer, the term of this patent is extended or adjusted under 35 U.S.C. 154(b) by 66 days.

(21) Appl. No.: 18/080,144

(22) Filed: Dec. 13, 2022

(65) Prior Publication Data
US 2023/0110124 A1 Apr. 13, 2023

Related U.S. Application Data

(63) Continuation of application No. PCT/CN2021/099914, filed on Jun. 12, 2021.

(30) Foreign Application Priority Data

Jun. 29, 2020 (CN) .......................... 202010609664.3

(51) Int. Cl.
*H03M 1/34* (2006.01)
*G06F 1/04* (2006.01)
(Continued)

(52) U.S. Cl.
CPC ................ *H03M 1/34* (2013.01); *G06F 1/04* (2013.01); *G06F 7/501* (2013.01); *H03M 1/14* (2013.01);
(Continued)

(58) Field of Classification Search
CPC . H03M 1/34; H03M 1/14; H03M 1/56; G06F 1/04; G06F 7/50; G06F 7/501; G06F 1/0321; H04N 25/772; H04N 25/75
(Continued)

(56) References Cited

U.S. PATENT DOCUMENTS

| 3,987,289 A | 10/1976 | Bredenkamp |
| 8,040,269 B2 * | 10/2011 | Bogaerts ............... H03M 1/123 341/169 |

(Continued)

FOREIGN PATENT DOCUMENTS

| CN | 107147859 A | 9/2017 |
| CN | 108353138 A | 7/2018 |

(Continued)

OTHER PUBLICATIONS

International Search Report issued in International application No. PCT/CN2021/099914, dated Jun. 12, 2021.

(Continued)

*Primary Examiner* — Khai M Nguyen
(74) *Attorney, Agent, or Firm* — BAYES PLLC

(57) ABSTRACT

An analog-to-digital conversion method, an analog-to-digital converter and an image sensor, are provided. The analog-to-digital conversion method includes a first conversion period and a second conversion period; in the first conversion period and the second conversion period, a first counter and the second counter have different effective clock edges and work in a time-sharing way using the first count clock signal and the second count clock signal respectively; in the second conversion period, count directions of the first counter and the second counter are reversed, and the count results in the first conversion period are used as an initial value of (Continued)

the second conversion period; and the conversion result is output based on the first count result and the second count result.

8 Claims, 11 Drawing Sheets

(51) Int. Cl.
   *G06F 7/501* (2006.01)
   *H03M 1/14* (2006.01)
   *H04N 25/772* (2023.01)
   *G06F 1/03* (2006.01)
   *H03M 1/56* (2006.01)
   *H04N 25/75* (2023.01)

(52) U.S. Cl.
   CPC ............. *G06F 1/0321* (2013.01); *H03M 1/56* (2013.01); *H04N 25/75* (2023.01); *H04N 25/772* (2023.01)

(58) Field of Classification Search
   USPC .......................................................... 341/155
   See application file for complete search history.

(56) References Cited

U.S. PATENT DOCUMENTS

| | | | |
|---|---|---|---|
| 9,041,579 B2 * | 5/2015 | Meynants | H03M 1/56 |
| | | | 341/169 |
| 9,185,316 B2 * | 11/2015 | Cheon | H04N 25/75 |
| 10,218,930 B2 * | 2/2019 | Shin | H03K 21/026 |
| 2003/0172205 A1 | 9/2003 | Bastian | |
| 2016/0235572 A1 | 8/2016 | Ingvarsson et al. | |

FOREIGN PATENT DOCUMENTS

| | | |
|---|---|---|
| CN | 108353139 A | 7/2018 |
| CN | 109792498 A | 5/2019 |
| CN | 110913153 A | 3/2020 |
| CN | 111294531 A | 6/2020 |
| CN | 111770293 A | 10/2020 |
| WO | 2018063566 A1 | 4/2018 |

OTHER PUBLICATIONS

Notice of Grant of invention patent rights issued in corresponding Chinese application No. 202010609664.3, dated Jun. 21, 2022.
First Office Action issued in corresponding Chinese application No. 202010609664.3, dated Mar. 9, 2022.

* cited by examiner

ANALOG-TO-DIGITAL CONVERSION METHOD, ANALOG-TO-DIGITAL CONVERTER AND IMAGE SENSOR

CROSS-REFERENCE TO RELATED APPLICATION

The present application is a continuation of International Application No. PCT/CN2021/099914, filed on Jun. 12, 2021, which claims the benefit of priority to Chinese Patent Application No. 202010609664.3, filed on Jun. 29, 2020. The entire contents of each of the above-identified applications are expressly incorporated herein by reference.

TECHNICAL FIELD

The present disclosure relates to the technical field of analog-to-digital conversion, and more particularly, to an analog-to-digital conversion method, an analog-to-digital converter and an image sensor.

BACKGROUND

Currently, image sensors respond to incident light by semiconductor photodiodes to convert optical signals into electrical signals, then generating images. A basic image sensor consists of a pixel array and an Analog-to-Digital Converter (ADC), which converts analog signals from the pixel array into digital signals.

The conversion speed of the analog-to-digital converter directly affects operating efficiency of the image sensor. So, it is necessary to increase the conversion speed of the analog-to-digital converter to improve the operating efficiency of the image sensor.

SUMMARY

The present disclosure aims at addressing at least one of the technical problems in the prior art. Therefore, the present disclosure provides an analog-to-digital conversion method, which compares ramp signals with analog signals in different conversion periods to generate comparison signals. A first counter and a second counter count at rising edges and falling edges of count clock signals in different time periods before and after the toggling of the comparison signal respectively, thereby improving the conversion precision of the digital-to-analog converter and shortens the conversion time.

The present disclosure further discloses an analog-to-digital converter to execute the analog-to-digital conversion method above.

The present disclosure further discloses an image sensor including the analog-to-digital converter.

According to a first aspect of the present disclosure, the presented analog-to-digital conversion method includes: in a first conversion period, resetting a ramp signal to a first reference level and take the first reference level as an initial level to generate a first ramp signal; acquiring a first analog signal and comparing the first ramp signal with the first analog signal to generate a first comparison signal; acquiring a count clock signal and generating a first count clock signal and a second count clock signal based on the first comparison signal and the count clock signal; starting counting of the first counter in a first count direction using the first count clock signal; stopping counting of the first counter after the toggle of the first comparison signal; starting counting of the second counter in a second count direction using the second count clock signal till the end of the first conversion period; in a second conversion period, reversing the count directions of the first counter and the second counter, and using count results of the first counter and the second counter in the first conversion period as initial values; resetting the ramp signal to a second reference level and taking the second reference level as an initial level to generate a second ramp signal; acquiring the second analog signal and comparing the second ramp signal with the second analog signal to generate a second comparison signal; generating a first count clock signal and a second count clock signal based on the second comparison signal and the count clock signal; starting counting of the first counter using the first count clock signal; stopping counting of the first counter after the toggle of the second comparison signal; and starting counting of the second counter using the second count clock signal till the end of the second conversion period; acquiring the first count result of the first counter and a second count result of the second counter, and outputting the final conversion result based on the first count result and the second count result; wherein, in the second conversion period, both the first counter and the second counter count in opposite directions to their count directions in the first conversion period respectively.

According to the embodiments of the disclosure, the analog-to-digital conversion method has at least the following beneficial effects: in each conversion period, the first count clock signal and the second count clock signal are generated based on the first comparison signal, the second comparison signal and the count clock signal. The first counter and the second counter perform time-sharing count in preset directions using the first count clock signal and the second count clock signal respectively. When the first comparison signal and the second comparison signal toggle, the first counter and the second counter perform count switching. The conversion result is output based on the first count result and the second count result. In this way, a conversion step of half a clock period is realized, which shortens the conversion period and improves the conversion efficiency. Both the first counter and the second counter switch the count directions at the interval of two conversion periods to realize double sampling of the first analog signal and the second analog signal to eliminate systematic offset.

According to some embodiments of the present disclosure, the first count direction and the second count direction are opposite; or the first count direction and the second count direction are the same.

According to some embodiments of the present disclosure, the method further includes, when the first count direction and the second count direction are opposite, adding the first count result and the second count result to output the conversion result.

According to some embodiments of the present disclosure, when the first count direction and the second count direction are the same, the first count result and the second count result are subtracted to output the conversion result.

According to some embodiments of the present disclosure, the first ramp signal and the second ramp signal are ramp signals from a low level to a high level; or the first ramp signal and the second ramp signal are ramp signals from a high level to a low level.

According to some embodiments of the present disclosure, the first reference level and the second reference level are the same; or the first reference level and the second reference level are different.

According to some embodiments of the present disclosure, the first counter counts at rising edges of the clock signal, and the second counter counts at falling edges of the clock signal; or the first counter counts at falling edges of the clock signal, and the second counter counts at rising edges of the clock signal.

An analog-to-digital converter according to some aspects of the present disclosure, wherein the analog-to-digital converter is used to execute the analog-to-digital conversion method.

According to the embodiments of the present disclosure, the analog-to-digital converter has at least the following beneficial effects: in each conversion period of the analog-to-digital converter, the first counter and the second counter perform time-sharing count along preset directions using the first count clock signal and the second count clock signal respectively. When the first comparison signal and the second comparison signal toggle, the first counter and the second counter perform count switching. The conversion result is output based on the first count result and the second count result. A conversion step of half a clock period can be realized, which shortens the conversion period and improves the conversion efficiency. Both the first counter and the second counter switch the count directions at the interval of two conversion periods to realize double sampling of the first analog signal and the second analog signal to eliminate systematic offset.

An image sensor according to a third aspect of the present disclosure, includes the analog-to-digital converter above.

The image sensor according to the embodiments of the present disclosure has at least the following beneficial effects: in the image sensor, by arranging the analog-to-digital converter in the above embodiments, in each conversion period of the analog-to-digital converter, the first counter and the second counter perform time-sharing count along preset directions using the first count clock signal and the second count clock signal respectively. When the first comparison signal and the second comparison signal toggle, the first counter and the second counter perform count switching. The conversion result is output based on the first count result and the second count result. A conversion step of half a clock period can be realized, which shortens the conversion period and improves the conversion efficiency. Both the first counter and the second counter switch count directions at the interval of two conversion periods to realize double sampling of the first analog signal and the second analog signal to eliminate systematic offset.

Part of the additional aspects and advantages of the present disclosure will be given in part in the following description, and will become apparent in part from the following description, or will be learned through the practice of the present disclosure.

BRIEF DESCRIPTION OF DRAWINGS

The above and/or additional aspects and advantages of the present disclosure will be more apparent with the following descriptions of the embodiments in conjunction with the accompanying drawings, wherein.

DETAILED DESCRIPTION

Figure 1:
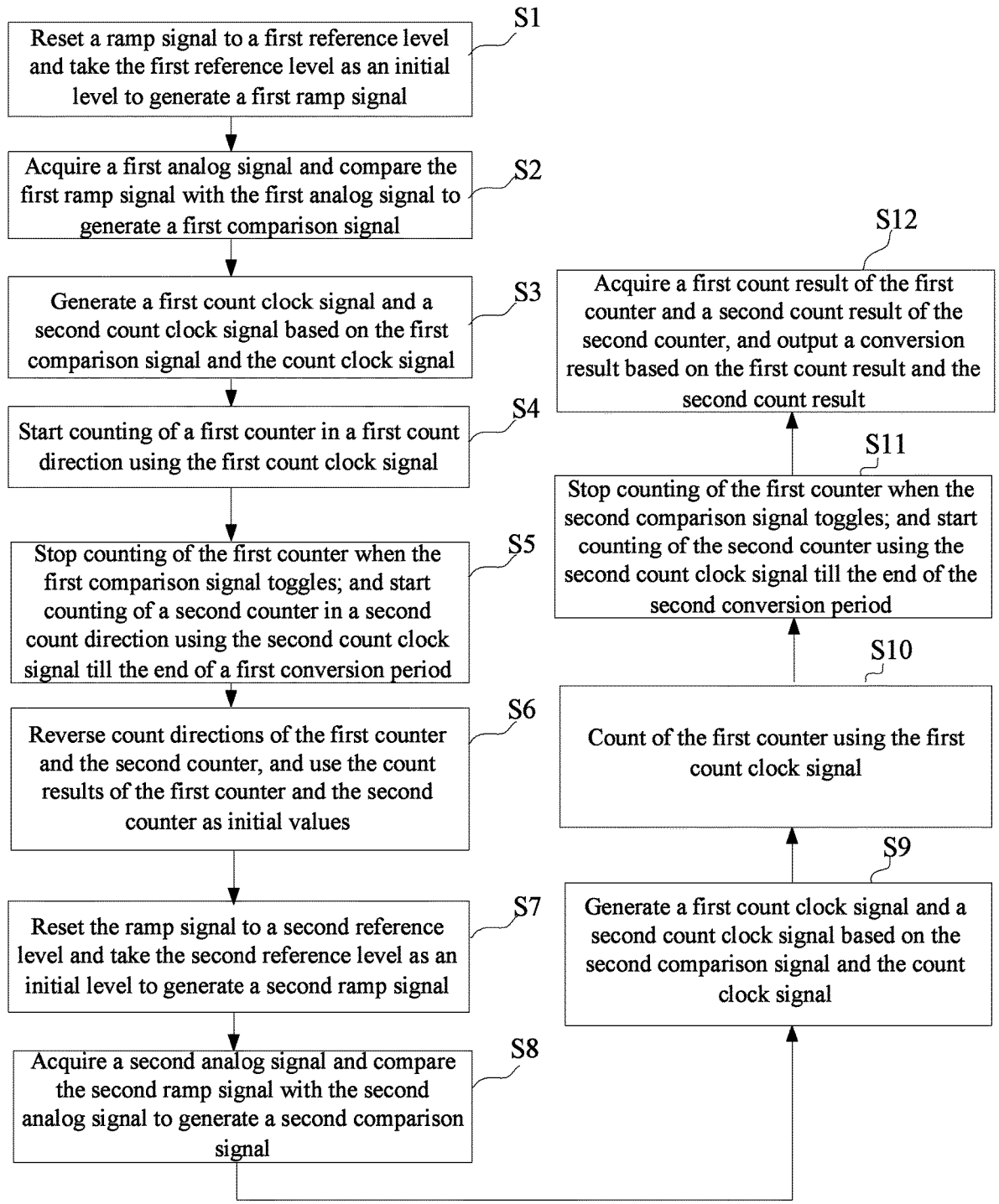
FIG. 1 is a flowchart of an analog-to-digital conversion method according to an embodiment of the present disclosure.

The embodiments of the present disclosure will be described in detail hereinafter. Examples of the embodiments are shown in the accompanying drawings. The same or similar reference numerals throughout the drawings denote the same or similar elements or elements having the same or similar functions. The embodiments described below with reference to the accompanying drawings are exemplary and are only intended to explain the present disclosure, but should not be construed as limiting the present disclosure.

In the description of the present disclosure, it shall be understood that the orientation or position relation related to the orientation description, such as the orientation or position relation indicated by the upper, lower, front, rear, left, right, etc., is based on the orientation or position relation shown in the drawings, which is only used for convenience of description of the present disclosure and simplification of description instead of indicating or implying that the indicated device or element must have a specific orientation, and be constructed and operated in a specific orientation, and thus shall not be understood as a limitation to the present disclosure.

In the description of the present disclosure, the meaning of several refers to be one or more, and the meaning of multiple refers to be more than two. The meanings of greater than, less than, more than, etc., are understood as not including this number, while the meanings of above, below, within, etc., are understood as including this number. If there is a description to the first and second, it is only for the purpose of distinguishing technical features, and shall not be understood as indicating or implying relative importance, implicitly indicating the number of the indicated technical features or implicitly indicating the order of the indicated technical features.

In the description of the present disclosure, unless otherwise explicitly defined, words such as setting, installing and connecting should be understood in a broad sense, and those skilled in the art can reasonably determine the specific meanings of the above words in the present disclosure, in combination with the specific contents of the technical solutions.

In semiconductor device imaging, a conversion speed of an analog-to-digital converter may directly affect operating efficiency of an image sensor. Therefore, how to improve the conversion speed of the analog-to-digital converter to improve the operating efficiency of the image sensor has become a technical problem to be solved.

Hence, the embodiments of the present disclosure provide an analog-to-digital conversion method and an analog-to-digital converter applied to an image sensor, which can improve an analog-to-digital conversion speed without increasing instantaneous power consumption generated in a digital-to-analog conversion process.

It should be noted that, according to specific needs, the analog-to-digital conversion methods and analog-to-digital converters in the following embodiments may be applied to different imaging processing devices, and descriptions of comparators, counters and adders are only exemplary descriptions of the implementations, and other electronic devices that can achieve the same functions may be used to replace them according to specific application environments.

Referring to FIG. 1, an analog-to-digital conversion method includes step S1: resetting a ramp signal to a first reference level and taking the first reference level as an initial level to generate a first ramp signal; step S2: acquiring a first analog signal and compare the first ramp signal with the first analog signal to generate a first comparison signal; step S3: acquiring a count clock signal and generating a first count clock signal and the second count clock signal based on the first comparison signal and the count clock signal; step S4: starting counting of a first counter in a first count direction using the first count clock signal; step S5: stopping counting of the first counter when the first comparison signal toggles; and starting counting of the second counter in the second count direction using the second count clock signal till the end of a first conversion period; step S6: reversing count directions of the first counter and the second counter, and using count results of the first counter and the second counter as initial values; step S7: resetting the ramp signal to a second reference level and taking the second reference level as an initial level to generate a second ramp signal; step S8: acquiring the second analog signal and comparing the second ramp signal with the second analog signal to generate a second comparison signal; step S9: generating a first count clock signal and a second count clock signal based on the second comparison signal and the count clock signal; step S10: starting counting of the first counter using the first count clock signal; step S11: stopping counting of the first counter when the second comparison signal toggles; and starting counting of the second counter using the second count clock signal till the end of the second conversion period; and step S12: acquiring a first count result of the first counter and a second count result of the second counter, and outputting a conversion result based on the first count result and the second count result; wherein, both the first counter and the second counter count in opposite directions of the first conversion period respectively.

When the first comparison signal and the second comparison signal toggle, the first counter and the second counter perform count switching. The final conversion result is based on the first count result and the second count result. In this way, a conversion step of half a clock period can be realized, which shortens the conversion period and improves the conversion efficiency.

For example, the first counter and the second counter count at rising edges and falling edges of the clock signal respectively. Both the count step of the first counter and the second counter is one clock period. When the first comparison signal toggles, the first counter stops counting, and at the same time, the second counter starts counting till the end of the first conversion period. The final conversion result based on the first count result and the second count result. A conversion step of half a clock period can be realized, which shortens the conversion time of the actual count of the digital-to-analog converter.

When the first conversion period and the second conversion period are done, the first count result and the second count result are processed to output the final conversion result. The conversion result is a sum of a quantization result and a fixed offset.

In some embodiments, a clock logic controller generates the first count clock signal and the second count clock signal based on the first comparison signal and the count clock signal. The first counter and the second counter perform time-sharing counting along preset directions using the first count clock signal and the second count clock signal respectively. The first counter and the second counter perform time-sharing counting in the same conversion period to improve conversion precision and shorten conversion time. It should be noted that in the same conversion period, the effective clock edges of the first counter and the second counter are different.

Figure 2:
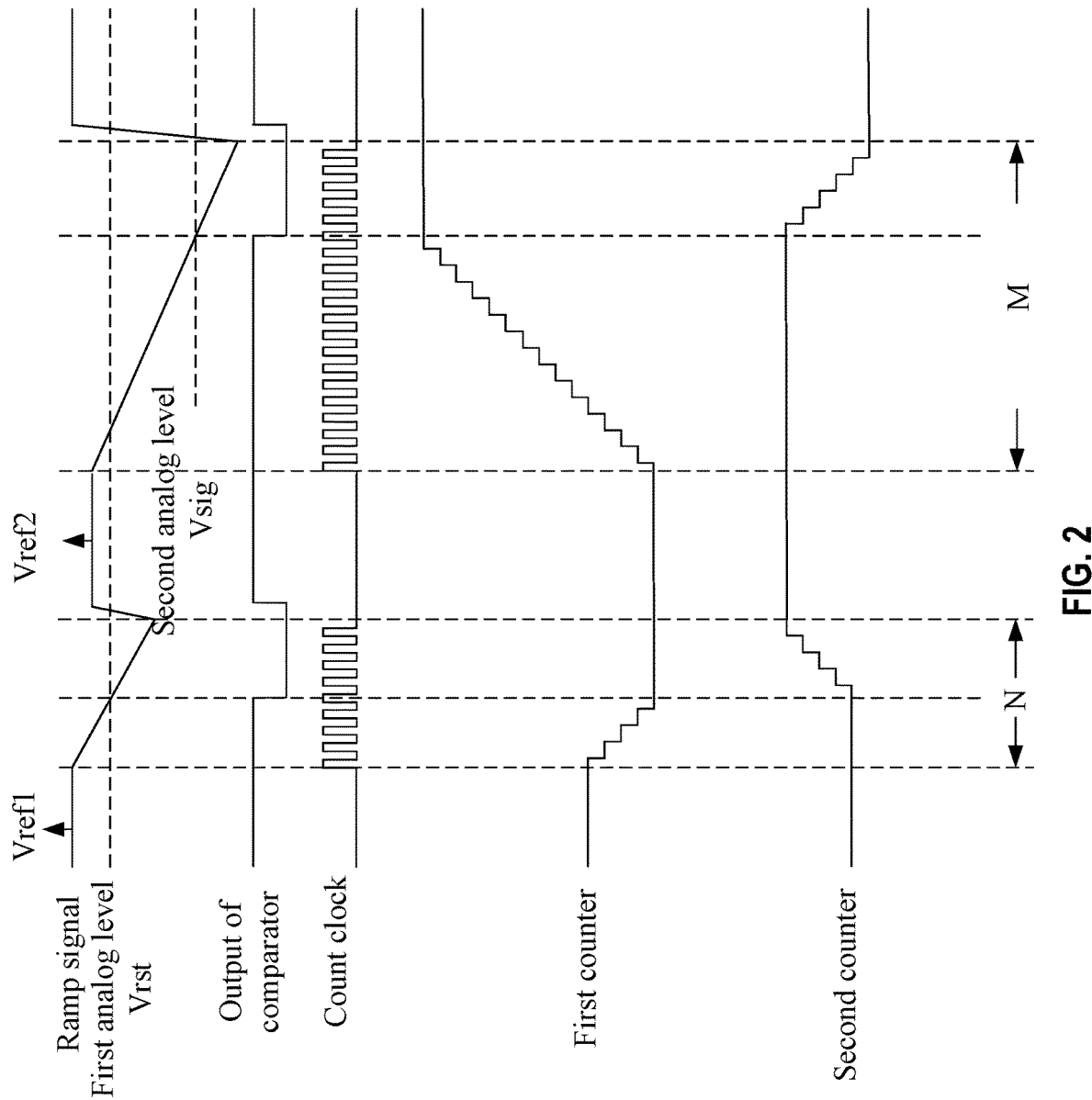
FIG. 2 is an example timing diagram of an analog-to-digital converter according to an embodiment of the present disclosure.
Figure 3:
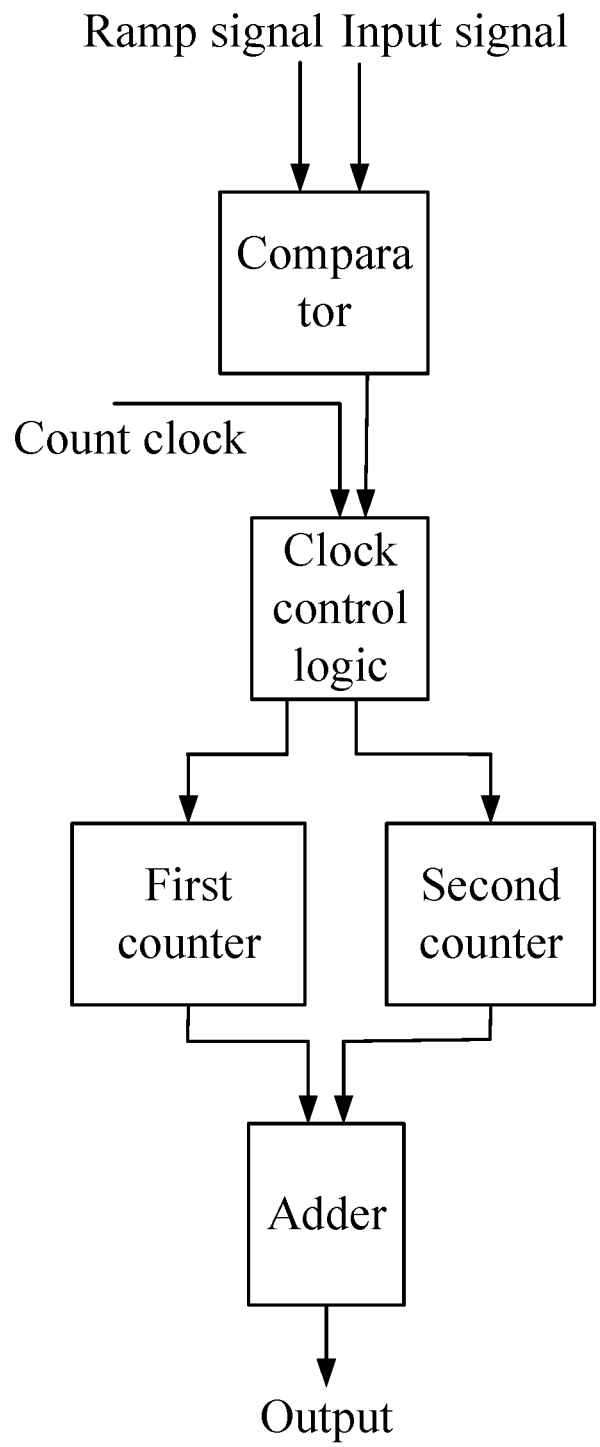
FIG. 3 is an example topology of the analog-to-digital converter according to an embodiment of the present disclosure.

Please refer to FIG. 2 and FIG. 3 together, the clock logic controller receives the first comparison signal and generates the first count clock signal and the second count clock signal, which drive the first counter and the second counter.

The first counter counts along the first count direction, and stops counting when the first comparison signal toggles; then the second counter starts counting in the second count direction using the second count clock signal. In the first conversion period, before the first comparison signal toggles, the first counter counts along the first count direction, and the second counter does not count; after the toggling of the first comparison signal, the first counter stops counting, and the second counter performs counting along the second count direction. When the first conversion period is completed, the first ramp signal is reset, and the first counter and the second counter stop counting.

In some embodiments, the first counter and the second counter may be set to perform time-sharing single-edge counting in opposite count directions.

In the same conversion period, the first counter and the second counter perform time-sharing counting, switching at the toggling point of the comparison signal. When one conversion period is done, both the first counter and the second counter stop counting. Then the count directions of the first counter and the second counter are reversed. When all conversion periods are finished, the first count result and the second count result are added to output the conversion result. It should be noted that the effective clock edges of the first counter and the second counter are different.

In some embodiments, the first counter and the second counter may be set to perform time-sharing single-edge counting in the same count direction.

In the same conversion period, the first counter and the second counter perform time-sharing counting, switching at the toggling point of the comparison signal. When one conversion period is done, the first counter and the second counter stop counting. Then the count directions of the first counter and the second counter are reversed. When two conversion periods are finished, the first count result and the second count result are subtracted to output the conversion result. It should be noted that the effective clock edges of the first counter and the second counter are different.

In this embodiment, the first counter counts along a first count direction and the second counter counts along a second count direction. That is, the first count direction counts down at clock falling edges and the second count direction counts up at clock rising edges.

In some embodiments, the first counter and the second counter may be other count directions according to specific requirements. For example, the first count direction counts up at clock rising edges and the second count direction counts down at clock falling edges.

Please refer to FIG. 1 and FIG. 2 together again, in the second conversion period, the second ramp signal is generated by take the second reference level as reference, and the second ramp signal is compared with the second analog signal to generate the second comparison signal. The clock logic controller generates the first count clock signal and the second count clock signal based on the second comparison signal and the count clock signal. The first counter and the second counter perform time-sharing counting using the first count clock signal and the second count clock signal respectively. Before the second conversion period starts, both the count directions of the first counter and the second counter are switched to opposite count directions compared with their respective count directions in the first conversion period.

In the first conversion period, the first counter counts down at clock falling edges, and the second counter counts up at clock rising edges; in the second conversion period, the first counter counts up at clock falling edges, and the second counter counts down at clock rising edges.

In the second conversion period, the first counter counts up at the falling edge of the first count clock signal, further includes: when the second comparison signal toggles, the first counter stops counting; and the second counter counts down at the falling edge of the second count clock signal. The first count result and the second count result obtained by the first counter and the second counter then are added to output the final conversion results.

In some implementations, the clock logic controller switches the counting states of the first counter and the second counter at the toggling points of the first comparison signal and the second comparison signal. For example, when the first comparison signal toggles, the first counter stops counting and the second counter starts counting; when the second comparison signal toggles, the first counter stops counting and the second counter starts counting.

When the second conversion period is done, the ramp signal is reset, and both the first counter and the second counter stop counting. An adder adds the count results of the first counter and the second counter to get the final conversion result of the analog-to-digital converter, which is the sum of the quantization result and a fixed offset.

The analog-to-digital converter based on the analog-to-digital conversion method above can correctly convert a difference between the first analog signal and the second analog signal. The first counter and the second counter switch the count direction at an interval of two conversion periods to realize double sampling of the first analog signal and the second analog signal to eliminate systematic offset. The counting step is half a clock period in this way. For example, assuming that an analog-to-digital conversion resolution of L bits is needed, the conversion time is (2L−1) clock periods.

Figure 4:
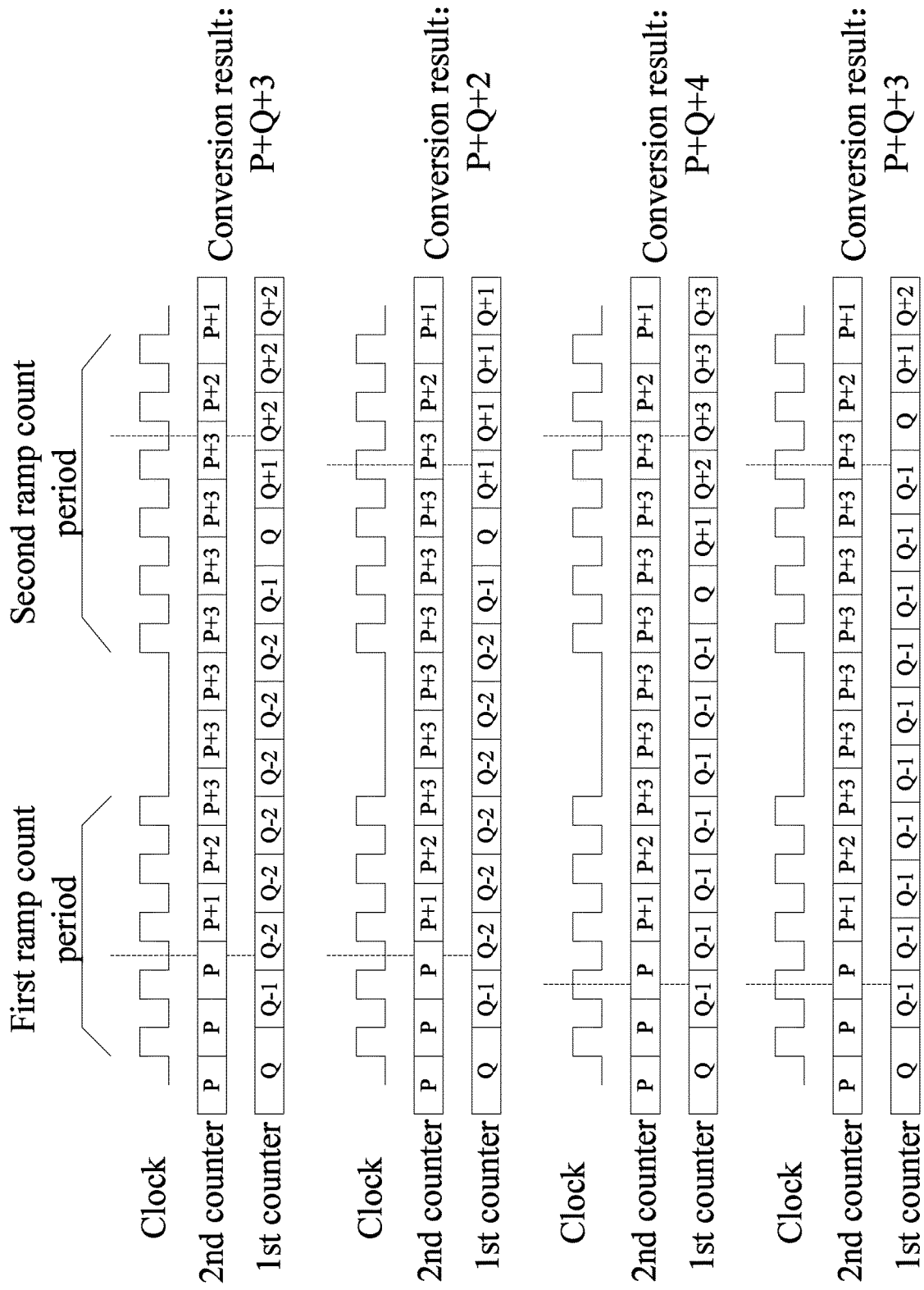
FIG. 4 is a description of count switching of the analog-to-digital converter according to an embodiment of the present disclosure.

Referring to FIG. 4, the following describes the conversion results of the digital-to-analog converter when the toggling of the first comparison signal and the second comparison signal occurs at a high level or a low level of the clock signal.

The first counter is a counter works at clock falling edges, and the second counter is a counter works at clock rising edges. Q represents an initial value of the first counter, P represents an initial value of the second counter, and the dotted lines represent the toggling points of the comparison signal in different conversion periods.

A first count condition is that: both the first comparison signal and the second comparison signal toggle at the clock low level.

In the first conversion period, the first counter starts counting down from the initial value Q. When the first comparison signal toggles, the first counter stops counting, and the count value is (Q−2); the second counter counts up from the initial value P until the end of the first conversion period, the second counter stops counting, and the count value is (P+3).

The first counter and the second counter stop counting at the interval between the first conversion period and the second conversion period.

In the second conversion period, the first counter starts counting up from the stored value (Q−2) of the first conversion period. When the second comparison signal toggles, the first counter stops counting, and the count value is (Q+2); the second counter counts down from the stored value (P+3) of the first conversion period until the end of the second conversion period, the second counter stops counting, and the count value is (P+1). The final conversion result (the sum of the count values of the first counter and the second counter) is (P+Q+3).

A second count condition is that: the first comparison signal toggles at the clock low level and the second comparison signal toggles at the clock high level.

In the first conversion period, the first counter starts counting down from the initial value Q. When the first comparison signal toggles, the first counter stops counting, and the count value is (Q−2); the second counter counts up from the initial value P until the end of the first conversion period, the second counter stops counting, and the count value is (P+3).

The first counter and the second counter stop counting at the interval between the first conversion period and the second conversion period.

In the second conversion period, the first counter starts counting up from the stored value (Q−2) of the first conversion period. When the second comparison signal toggles, the first counter stops counting, and the count value is (Q+1); the second counter counts down from the stored value (P+3) of the first conversion period until the end of the second conversion period, the second counter stops counting, and the count value is (P+1). The final conversion result (the sum of the count values of the first counter and the second counter) is (P+Q+2).

A third count condition is that: the first comparison signal toggles at the clock high level and the second comparison signal toggles at the clock low level.

In the first conversion period, the first counter starts counting down from the initial value Q. When the first comparison signal toggles, the first counter stops counting, and the count value is (Q−1); the second counter counts up from the initial value P until the end of the first conversion period, the second counter stops counting, and the count value is (P+3).

The first counter and the second counter stop counting at the interval between the first conversion period and the second conversion period.

In the second conversion period, the first counter starts counting up from the stored value (Q−1) of the first conversion period. When the second comparison signal toggles, the first counter stops counting, and the count value is (Q+3); the second counter counts down from the stored value (P+3) of the first conversion period until the end of the second conversion period, the second counter stops counting, and the count value is (P+1). The final conversion result (the sum of the count values of the first counter and the second counter) is (P+Q+4).

A fourth counting condition is that: both the first comparison signal and the second comparison signal toggle at the clock high level.

In the first conversion period, the first counter starts counting down from the initial value Q. When the first comparison signal toggles, the first counter stops counting, and the count value is (Q−1); the second counter counts up from the initial value P until the end of the first conversion period, the second counter stops counting, and the count value is (P+3).

The first counter and the second counter stop counting at the interval between the first conversion period and the second conversion period.

In the second conversion period, the first counter starts counting up from the stored value (Q−1) of the first conversion period. When the second comparison signal toggles, the first counter stops counting, and the count value is (Q+2); the second counter counts down from the stored value (P+3) of the first conversion period until the end of the second conversion period, the second counter stops counting, and the count value is (P+1). The final conversion result (the sum of the count values of the first counter of the second counter) is (P+Q+3).

Referring to FIG. 4, it can be known from the above description that, in different counting scenarios, when the toggling point of the first comparison signal crosses the clock edge, i.e., half a clock period, the difference of the final conversion result is 1; when the toggling point of the second comparison signal crosses the clock edge, i.e., half a clock period, the difference of the final conversion result is 1. Therefore, the analog-to-digital conversion method can realize a conversion step of half a clock period, thus improving the analog-to-digital conversion efficiency.

In some embodiments, the first ramp signal and the second ramp signal are ramp signals from a low level to a high level; or the first ramp signal and the second ramp signal are ramp signals from a high level to a low level. By setting different types of ramp signals, the analog-to-digital converter is suitable for different analog-to-digital conversion scenarios.

Figure 5:
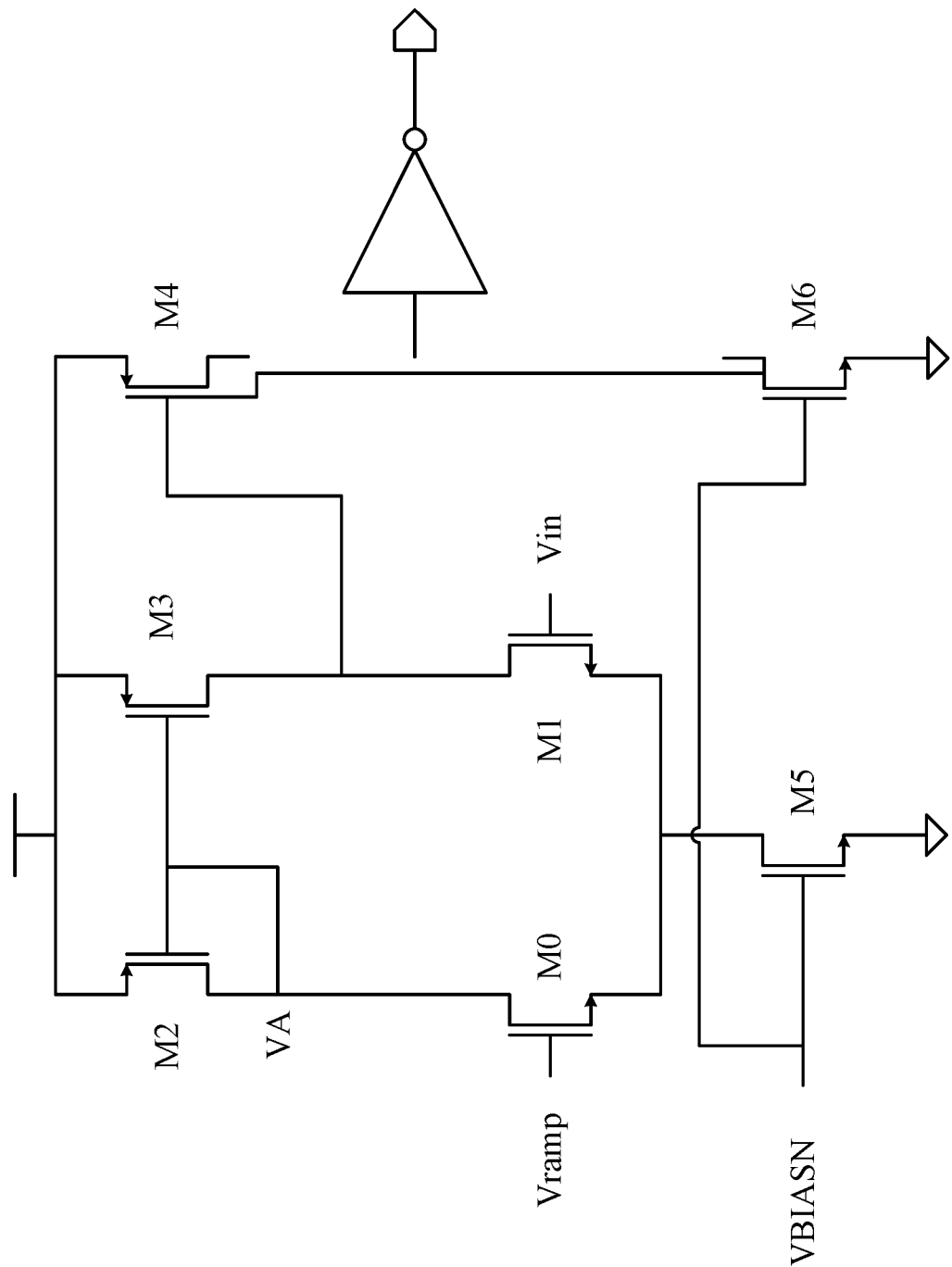
FIG. 5 is an example schematic of a comparator in the analog-to-digital converter according to an embodiment of the present disclosure.

Referring to FIG. 5, FIG. 5 is an example schematic of a comparator of the analog-to-digital converter according to an embodiment of the present disclosure. Vramp is a ramp signal, Vin is an analog input signal, VBIASN is a bias voltage of a current mirror transistor M5 and a current mirror transistor M6, and Vout is an output signal of the comparator.

The currents of the current mirror transistor M5 and the current mirror transistor M6 are controlled by the bias voltage VBIASN. The ramp signal Vramp and the analog input signal Vin are compared to generate a comparison signal which is the output signal Vout of the comparator. The output signal Vout drives the first counter and the second counter via a clock control logic. When the comparison signal Vout, which is generated by comparing the ramp signal Vramp with the analog input signal Vin, toggles, the output signal Vout drives the first counter to stop counting and the second counter to start counting.

Figure 6:
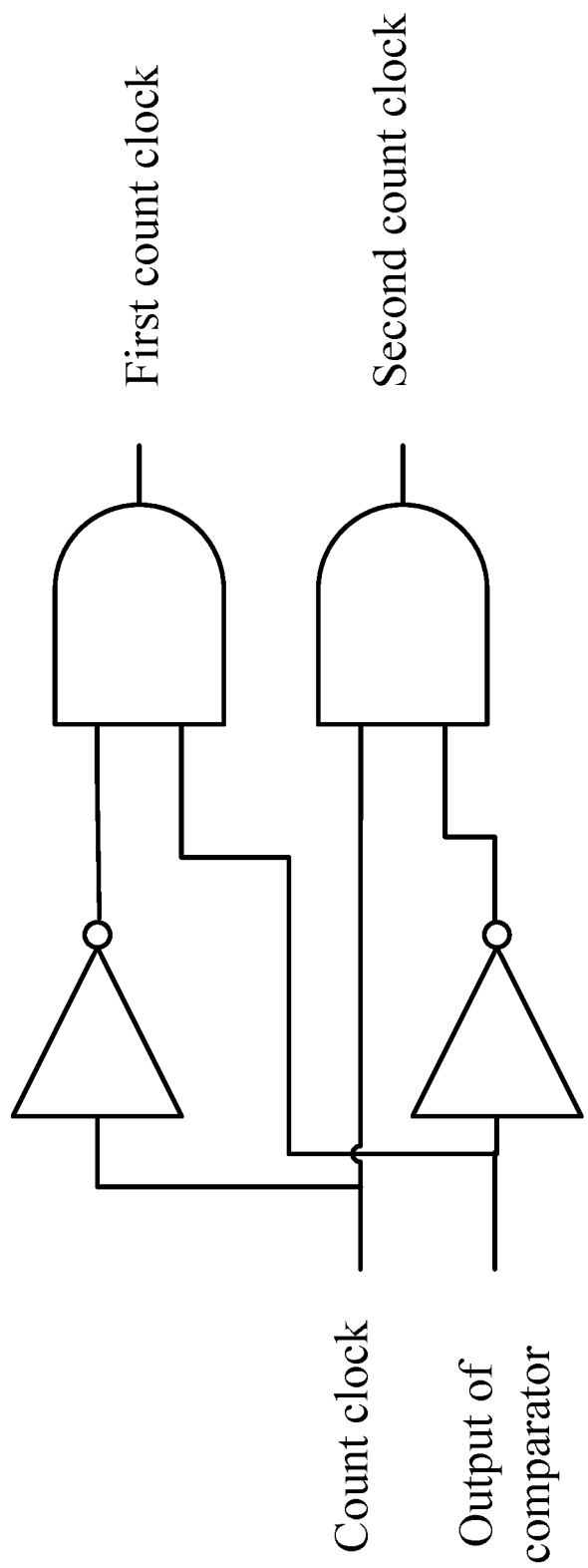
FIG. 6 is an example of clock control logic of the analog-to-digital converter according to an embodiment of the present disclosure.

Referring to FIG. 6, the count clock and the output signal of the comparator generate the first count clock signal and the second count clock signal through the clock control logic to drive the first counter and the second counter respectively, so that the first counter and the second counter can realize time-sharing counting.

Figure 7:
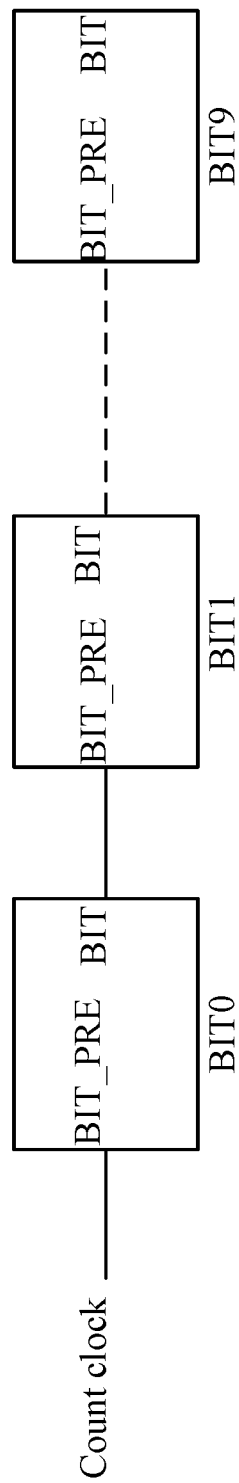
FIG. 7 is an example topology of asynchronous counter of the analog-to-digital converter according to an embodiment of the present disclosure.

Referring to FIG. 7, the counter includes multiple bits, which can be implemented as an asynchronous counter, that is, the multiple bits are sequentially connected using bit counters. The initial count clock is only used as a count clock of the least-significant bit counter. The input count clocks of other bit counters are the outputs of the respective previous bit counters.

Figure 8:
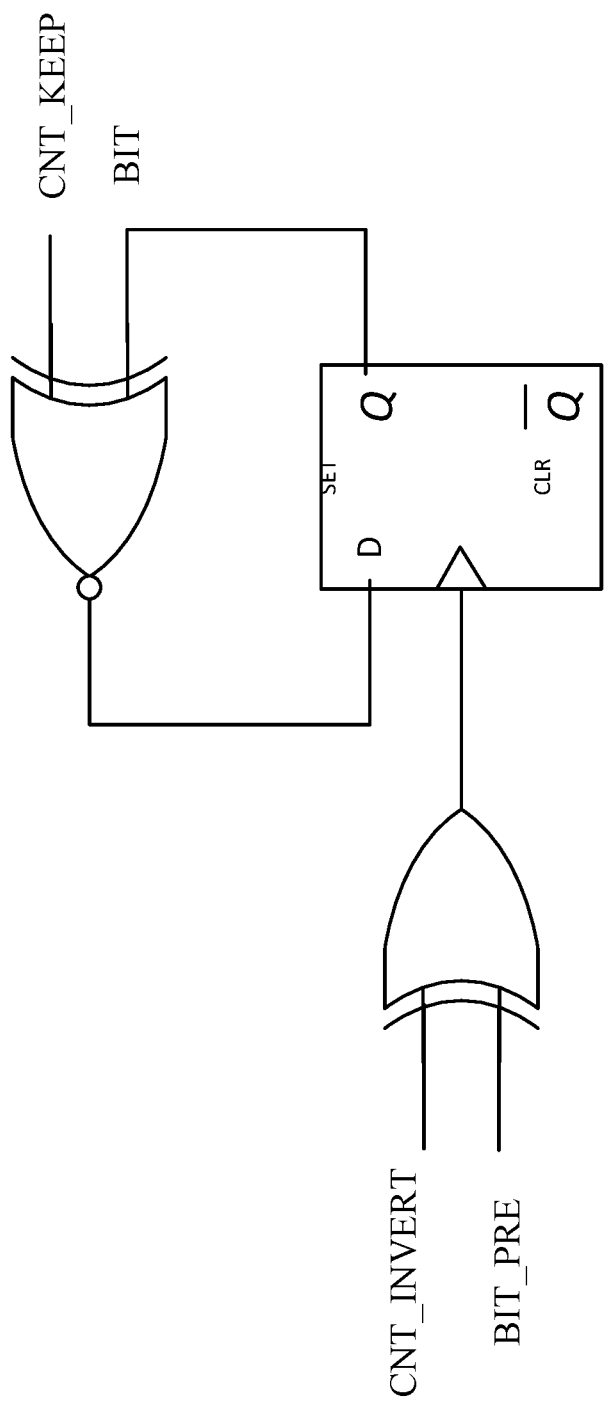
FIG. 8 is an example schematic of a 1-bit counter of the first counter of the analog-to-digital converter according to an embodiment of the present disclosure.
Figure 9:
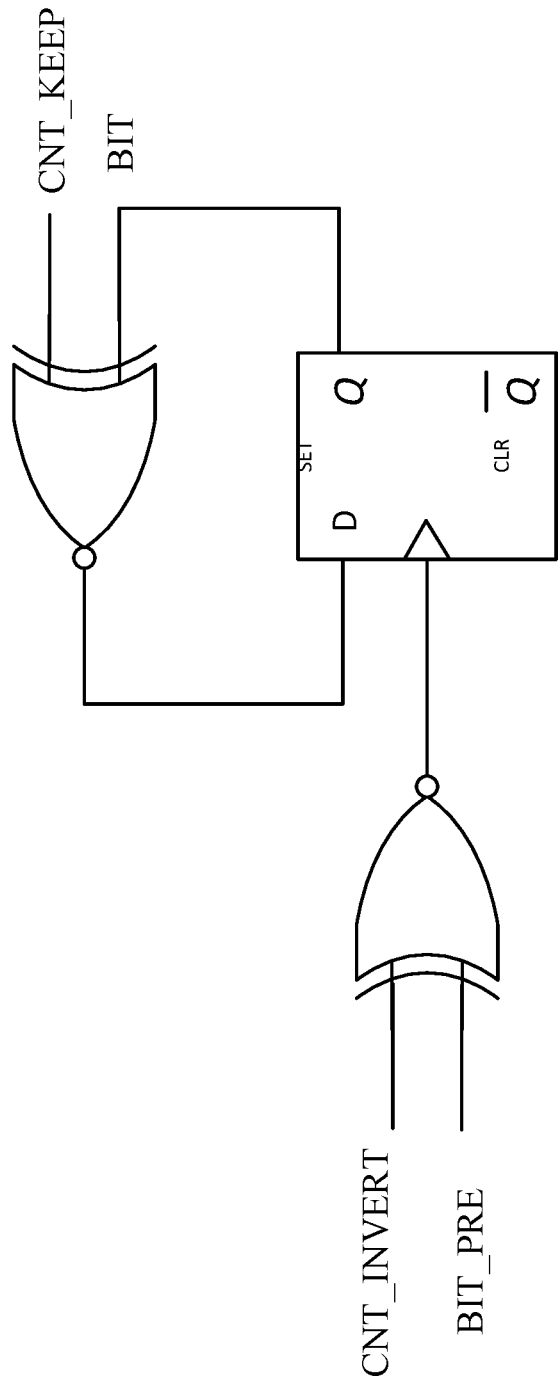
FIG. 9 is an example schematic of a 1-bit counter of the second counter of the analog-to-digital converter according to an embodiment of the present disclosure.

Referring to FIG. 8 and FIG. 9, BIT is the output signal of a current bit counter, BIT_PRE is the output signal of a previous bit counter. CNT_INVERT and CNT_KEEP are control signals needed to control the count direction of the counter. Each bit counter outputs the respective result according to the control of the control signal CNT_INVERT, the control signal CNT_KEEP and the input signal BIT_PRE.

The previous bit counter output signal BIT is connected to BIT_PRE of current bit counter. The current bit counter outputs signal BIT to BIT_PRE of next bit counter. The control signals CNT_INVERT and CNT_KEEP of different bit counters can be the same.

Figure 10:
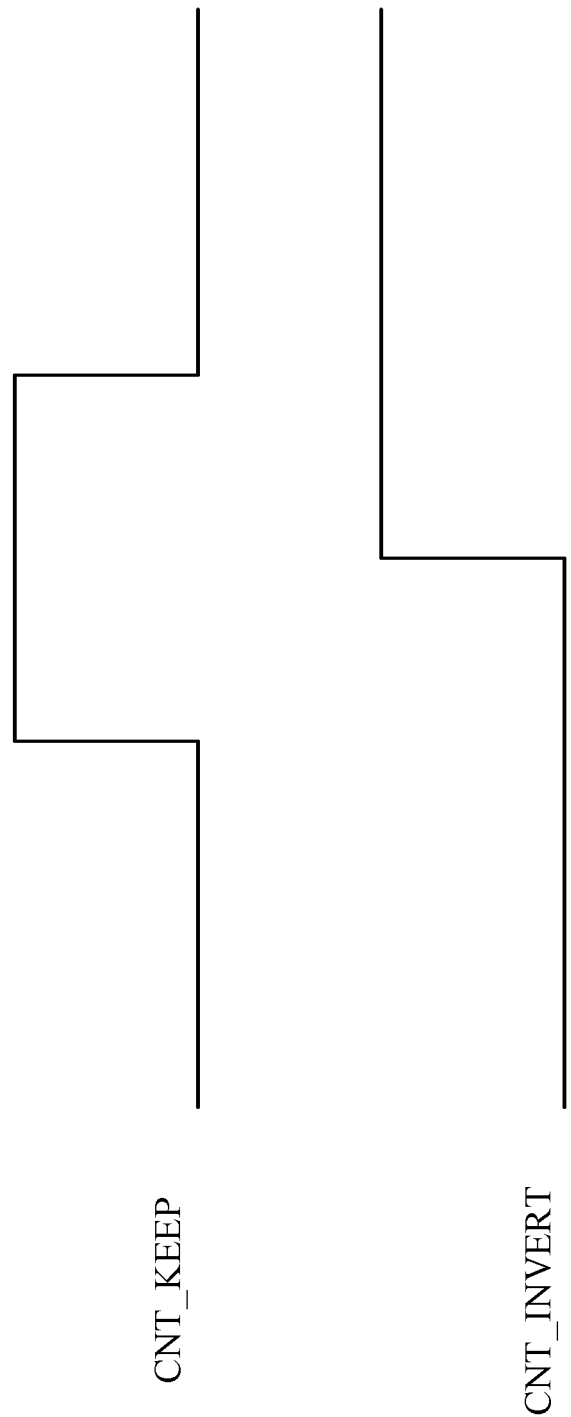
FIG. 10 is a timing diagram of count direction control of the analog-to-digital converter according to an embodiment of the present disclosure.

As shown in FIG. 10, during the interval between the first conversion period and the second conversion period, the control signal CNT_INVERT toggles to invert the count directions of the first counter and the second counter. The control signal CNT_KEEP needs to be at high level before CNT_INVERT toggles and return to a low level before the second conversion period starts, in order not to destroy the stored count results in the first conversion period.

Figure 11:
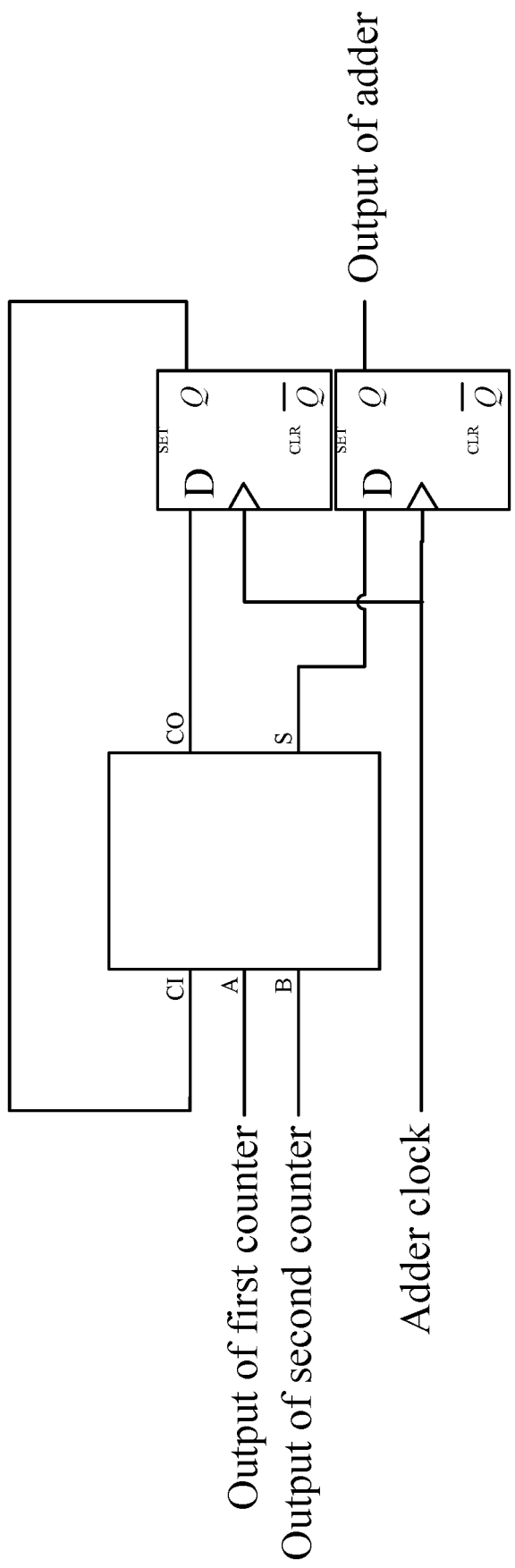
FIG. 11 is an example schematic of a full adder of the analog-to-digital converter according to an embodiment of the present disclosure.

Referring to FIG. 11, when the first conversion period and the second conversion period are done, a full adder adds the output results of the first counter and the second counter to get the final analog-to-digital conversion result. As shown in FIG. 11, the adder works bit-by-bit sequentially, starting from the least significant bit. Only one bit can be done in one adder clock period. This process is finished until the most significant bit.

In some embodiments, an analog-to-digital converter is also provided, and the analog-to-digital converter is used to execute the analog-to-digital conversion method according to the above embodiments.

In the analog-to-digital converter, the first counter and the second counter perform time-sharing counting along preset directions using the first count clock signal and the second count clock signal. When the first and the second comparison signals toggle, the first counter and the second counter switch counting. That is, at the same moment when the first counter stops counting, the second counter starts counting. Furthermore, the effective clock edges of the two counters are different. The final conversion result is based on the first count result and the second count result. In this way, a conversion step of half a clock period can be realized, which shortens the conversion time of the digital-to-analog converter.

In some embodiments, an image sensor is also provided. The image sensor includes the analog-to-digital converter according to the above embodiments.

In the image sensor, by setting the analog-to-digital converter in the above embodiment, when the first comparison signal toggles, the first counter and the second counter perform count switching. The conversion result is output based on the first count result and the second count result. In this way, a conversion step of half a clock period can be realized, which shortens the conversion period and improves the conversion efficiency.

The embodiments of the present disclosure are described in detail with reference to the drawings above, but the present disclosure is not limited to the above embodiments, and various changes may also be made within the knowledge scope of those of ordinary skills in the art without departing from the purpose of the present disclosure.

The device embodiments described above are only exemplary, where the units that are described as separate components may or may not be physically separated, i.e., may be located in one place or distributed to a plurality of network units. Part or all modules therein may be selected according to actual needs to realize the objective of achieving the technical solution of the embodiment.

In the descriptions of the specification, the descriptions with reference to the terms "one embodiment," "some embodiments," "illustrative embodiment," "example," "specific example," "some examples," or the like, refer to that specific features, structures, materials, or characteristics described with reference to the embodiments or examples are included in at least one embodiment or example of the present disclosure. In the specification, the schematic representation of the above terms does not necessarily mean the same embodiment or example. Moreover, the specific features, structures, materials or characteristics described may be combined in any one or more embodiments or examples in a suitable manner.

Although the embodiments of the present disclosure have been shown and described, those of ordinary skills in the art should understand that: various changes, amendments, substitutions and modifications can be made to these embodiments without departing from the principles and purposes of the present disclosure, and the scope of the present disclosure is limited by the claims and equivalents thereof.

What is claimed is:

1. An analog-to-digital conversion method, comprising:
   in a first conversion period:
      resetting a ramp signal to a first reference level and taking the first reference level as an initial level to generate a first ramp signal;
      acquiring a first analog signal and comparing the first ramp signal with the first analog signal to generate a first comparison signal;
      acquiring a count clock signal and generating a first count clock signal and a second count clock signal based on the first comparison signal and the count clock signal;
      starting counting of a first counter in a first count direction using the first count clock signal; and
      stopping counting of the first counter when the first comparison signal toggles, and starting counting of a second counter in a second count direction using the second count clock signal till end of the first conversion period; and in a second conversion period:
      reversing count directions of the first counter and the second counter, respectively, and using a first count result of the first counter and a second count result of the second counter as initial values;
      resetting the ramp signal to a second reference level and taking the second reference level as an initial level to generate a second ramp signal;
      acquiring a second analog signal and comparing the second ramp signal with the second analog signal to generate a second comparison signal;
      generating a third count clock signal and a fourth count clock signal based on the second comparison signal and the count clock signal;
      starting counting of the first counter in a third count direction using the third count clock signal;
      stopping counting of the first counter when the second comparison signal toggles, and starting counting of the second counter in a fourth count direction using the fourth count clock signal till the end of the second conversion period; and
      acquiring the first count result of the first counter and the second count result of the second counter, and outputting a conversion result based on the first count result and the second count result,
   wherein the third count direction is an opposite direction to the first count direction, and the fourth count direction is an opposite direction to the second count direction, and
   wherein the first ramp signal and the second ramp signal are ramp signals from a low level to a high level, or the first ramp signal and the second ramp signal are ramp signals from a high level to a low level.

2. The analog-to-digital conversion method of claim 1, wherein:
   the first count direction and the second count direction are opposite; or
   the first count direction and the second count direction are the same.

3. The analog-to-digital conversion method of claim 2, further comprising:
   when the first count direction and the second count direction are opposite, adding the first count result and the second count result to output the conversion result.

4. The analog-to-digital conversion method of claim 2, further comprising:
   when the first count direction and the second count direction are the same, subtracting the first count result and the second count result by an adder to output the conversion result.

5. The analog-to-digital conversion method of claim 1, wherein:
   the first reference level and the second reference level are the same; or
   the first reference level and the second reference level are at different levels.

6. The analog-to-digital conversion method of claim 1, wherein:
   the first counter counts at rising edges of the first count clock signal and the third count clock signal, and the second counter counts at falling edges of the second count clock signal and the fourth count clock signal; or
   the first counter counts at falling edges of the first count clock signal and the third count clock signal, and the second counter counts at rising edges of the second count clock signal and the fourth count clock signal.

7. An analog-to-digital converter, wherein the analog-to-digital converter performs the analog-to-digital conversion method of claim 1.

8. An image sensor, comprising the analog-to-digital converter of claim 7.

\* \* \* \* \*